(12) United States Patent
Xiao et al.

(10) Patent No.: US 12,099,081 B2
(45) Date of Patent: Sep. 24, 2024

(54) METHOD AND DEVICE FOR DETECTING INSULATION IMPEDANCE OF PHOTOVOLTAIC INVERTER

(71) Applicant: Gree Electric Appliances, Inc. of Zhuhai, Guangdong (CN)

(72) Inventors: Zunhui Xiao, Guangdong (CN); Meng Huang, Guangdong (CN); Jing Wang, Guangdong (CN); Xianqiao Yu, Guangdong (CN); Hongdi An, Guangdong (CN); Ningning Chen, Guangdong (CN)

(73) Assignee: Gree Electric Appliances, Inc. of Zhuhai, Zhuhai (CN)

( * ) Notice: Subject to any disclaimer, the term of this patent is extended or adjusted under 35 U.S.C. 154(b) by 149 days.

(21) Appl. No.: 18/016,399

(22) PCT Filed: Sep. 10, 2021

(86) PCT No.: PCT/CN2021/117567
§ 371 (c)(1),
(2) Date: Jan. 16, 2023

(87) PCT Pub. No.: WO2022/105380
PCT Pub. Date: May 27, 2022

(65) Prior Publication Data
US 2023/0288461 A1    Sep. 14, 2023

(30) Foreign Application Priority Data

Nov. 20, 2020 (CN) .......................... 202011312257.2

(51) Int. Cl.
*G01R 27/02* (2006.01)
(52) U.S. Cl.
CPC ................................. *G01R 27/02* (2013.01)

(58) Field of Classification Search
CPC ........ G01R 31/42; G01R 27/02; G01R 31/52; G01R 27/025; G01R 31/1227; H02S 50/10; H02S 50/00; Y02E 10/50; Y02E 10/56
See application file for complete search history.

(56) References Cited

U.S. PATENT DOCUMENTS

| 2008/0085215 A1 | 4/2008 | Mototsu et al. |
| 2012/0014202 A1 | 1/2012 | Tzou et al. |

(Continued)

FOREIGN PATENT DOCUMENTS

| CN | 103048544 A | 4/2013 |
| CN | 103091560 A | 5/2013 |

(Continued)

*Primary Examiner* — Jermele M Hollington
*Assistant Examiner* — Zannatul Ferdous
(74) *Attorney, Agent, or Firm* — The Webb Law Firm

(57) ABSTRACT

The present disclosure provides a method and device for detecting insulation impedance of a photovoltaic inverter. The method includes: detecting, after a first path of photovoltaic input is electrically connected to the photovoltaic inverter, whether a second path of photovoltaic input needs to be electrically connected to the photovoltaic inverter; if the second path of photovoltaic input needs to be electrically connected to the photovoltaic inverter, causing the first path of photovoltaic input to stop operating, and then detecting insulation impedance of the second path of photovoltaic input; judging whether the insulation impedance of the second path of photovoltaic input satisfies a preset impedance condition; and if the insulation impedance of the second path of photovoltaic input satisfies the preset impedance condition, causing the second path of photovoltaic input to be electrically connected to the photovoltaic inverter, and causing the first path of photovoltaic input and the second path of photovoltaic input to perform grid-connected operation. The present disclosure resolves the (Continued)

problem in the prior art that insulation detection is inaccurate when two paths of photovoltaic input are grid-connected, such that insulation impedance detection results are more accurate, thereby increasing the safety of the inverter.

11 Claims, 5 Drawing Sheets

(56) References Cited

U.S. PATENT DOCUMENTS

| | | | |
|---|---|---|---|
| 2015/0054523 | A1 | 2/2015 | Perkinson |
| 2017/0364040 | A1* | 12/2017 | Ni .............................. H02J 3/46 |
| 2023/0402972 | A1* | 12/2023 | Lin ........................... H02J 1/10 |

FOREIGN PATENT DOCUMENTS

| | | | |
|---|---|---|---|
| CN | 104535839 | A | 4/2015 |
| CN | 204439723 | U | 7/2015 |
| CN | 105548712 | A | 5/2016 |
| CN | 205229304 | U | 5/2016 |
| CN | 106324359 | A | 1/2017 |
| CN | 106771834 | A | 5/2017 |
| CN | 104977471 | B | 2/2018 |
| CN | 108427038 | A | 8/2018 |
| CN | 108896822 | A | 11/2018 |
| CN | 112557754 | A | 3/2021 |

\* cited by examiner ced to the photovoltaic inverter, and causing the first path of photovoltaic input and the second path of photovoltaic input to perform grid-connected operation.

METHOD AND DEVICE FOR DETECTING INSULATION IMPEDANCE OF PHOTOVOLTAIC INVERTER

CROSS-REFERENCE TO RELATED APPLICATIONS

This application is the United States national phase of International Patent Application No. PCT/CN2021/117567 filed Sep. 10, 2021, and claims priority to Chinese Patent Application No. 202011312257.2 filed Nov. 20, 2020, the disclosures of which are hereby incorporated by reference in their entireties.

BACKGROUND OF THE INVENTION

Field of the Invention

The present disclosure relates to the photovoltaic field, and specifically to a method and device for detecting insulation impedance of a photovoltaic inverter.

Description of Related Art

As compared with small electronic devices, an input voltage of a photovoltaic grid-connected inverter is relatively high. For example, the maximum input voltage of a high-power photovoltaic grid-connected inverter can be 600V. Open-air photovoltaic arrays are susceptible to dust, rain, snow, wind, and the like, thereby significantly affecting the insulation degree of two photovoltaic input ends to the earth. The detection of insulation impedance plays a vital role in personal safety. The photovoltaic grid-connected inverter must be detected for insulation impedance (Riso) of photovoltaic input arrays, so as to determine whether it can be started up. If the photovoltaic grid-connected inverter cannot be started up, its fault point must be found and eliminated in time.

Double-path DCDC insulation impedance is mutually restricted during detection. If a first path of photovoltaic input is in operation, a second path of photovoltaic input is electrically connected. Directly performing insulation impedance on the second path of photovoltaic input is prone to cause insensitivity to detection of insulation impedance and misinformation.

For the problem in relevant technologies that insulation detection is inaccurate when two paths of photovoltaic input are grid-connected, no effective solution has been put forward at present.

SUMMARY OF THE INVENTION

The present disclosure provides a method and device for detecting insulation impedance of a photovoltaic inverter, which resolves at least the problem in the prior art that insulation detection is inaccurate when two paths of photovoltaic input are grid-connected.

To resolve the technical problem, according to one aspect of an embodiment of the present disclosure, a method for detecting insulation impedance of a photovoltaic inverter is provided, where the photovoltaic inverter has two paths of photovoltaic input. The method includes: detecting, after a first path of photovoltaic input is electrically connected to the photovoltaic inverter, whether a second path of photovoltaic input needs to be electrically connected to the photovoltaic inverter; if the second path of photovoltaic input needs to be electrically connected to the photovoltaic inverter, causing the first path of photovoltaic input to stop operating, and then detecting insulation impedance of the second path of photovoltaic input; judging whether the insulation impedance of the second path of photovoltaic input satisfies a preset impedance condition; and if the insulation impedance of the second path of photovoltaic input satisfies the preset impedance condition, causing the second path of photovoltaic input to be electrically connected to the photovoltaic inverter, and causing the first path of photovoltaic input and the second path of photovoltaic input to perform grid-connected operation.

In some embodiments, before connecting the first path of photovoltaic input to the photovoltaic inverter, the method further includes: causing a unit in which the photovoltaic inverter is located to perform initialization configuration; and causing the unit to perform safety self-test, and performing mode configuration after the safety self-test passes.

In some embodiments, after the performing mode configuration, the method further includes: judging whether an input voltage satisfies a preset voltage condition; and if the input voltage satisfies the preset voltage condition, causing the first path of photovoltaic input to be electrically connected to the photovoltaic inverter.

In some embodiments, the judging whether an input voltage satisfies a preset voltage condition includes: detecting whether the input voltage is greater than a preset first input voltage; if the input voltage is greater than the preset first input voltage, determining that the input voltage satisfies the preset voltage condition; or if the input voltage is less than the preset first input voltage, detecting, after a preset delay, whether the input voltage is less than a preset second input voltage, where the preset second input voltage is less than the preset first input voltage; and if the input voltage is less than the preset second input voltage, determining that the input voltage does not satisfy the preset voltage condition.

In some embodiments, the causing a unit in which the photovoltaic inverter is located to perform initialization configuration includes: causing resetting of each IO port and assigning an initial value to each variable.

In some embodiments, the causing the unit to perform safety self-test includes at least one of the following: detecting whether power grid frequency is normal, detecting whether an AD sampling bias voltage needs to be calibrated, and detecting whether leakage current exceeds a limit.

In some embodiments, the method further includes: detecting, when the first path of photovoltaic input and the second path of photovoltaic input are not electrically connected to the photovoltaic inverter, whether the first path of photovoltaic input and the second path of photovoltaic input need to be electrically connected to the photovoltaic inverter; if the first path of photovoltaic input and the second path of photovoltaic input need to be electrically connected to the photovoltaic inverter, detecting insulation impedance of the first path of photovoltaic input, and judging whether the insulation impedance of the first path of photovoltaic input satisfies the preset impedance condition; if the insulation impedance of the first path of photovoltaic input satisfies the preset impedance condition, detecting the insulation impedance of the second path of photovoltaic input, and judging whether the insulation impedance of the second path of photovoltaic input satisfies the preset impedance condition; and if the insulation impedance of the second path of photovoltaic input satisfies the preset impedance condition, causing the first path of photovoltaic input and the second path of photovoltaic input to perform grid-connected operation.

According to another aspect of an embodiment of the present disclosure, a device for detecting insulation impedance of a photovoltaic inverter is provided, and the photovoltaic inverter has two paths of photovoltaic input. The device includes: a connection detecting module, configured to: detect, after a first path of photovoltaic input is electrically connected to the photovoltaic inverter, whether a second path of photovoltaic input needs to be electrically connected to the photovoltaic inverter; an insulation impedance detecting module electrically connected to the connection detecting module, configured to:detect, after the first path of photovoltaic input stops operating, insulation impedance of the second path of photovoltaic input; a judging module electrically connected to the insulation impedance detecting module, configured to: judge whether the insulation impedance of the second path of photovoltaic input satisfies a preset impedance condition; and a control module electrically connected to the judging module, configured to: cause the second path of photovoltaic input to be electrically connected to the photovoltaic inverter, and cause the first path of photovoltaic input and the second path of photovoltaic input to perform grid-connected operation.

According to another aspect of an embodiment of the present disclosure, a photovoltaic power generation system is provided, including the device for detecting insulation impedance of a photovoltaic inverter.

According to still another aspect of an embodiment of the present disclosure, a photovoltaic air conditioner, including the photovoltaic power generation system.

According to still another aspect of an embodiment of the present disclosure, a storage medium containing a computer-executable instruction is provided, where when being executed by a computer processor, the computer-executable instruction is used to perform the method for detecting insulation impedance of a photovoltaic inverter.

In the present disclosure, a method for detecting insulation impedance of two paths of photovoltaic input is provided. The method includes: connecting, when one path of photovoltaic input is in normal operation, the other path of photovoltaic input; detecting, after a first path of photovoltaic input stops operating, insulation impedance of a second path of photovoltaic input, and then judging the insulation impedance of the second path of photovoltaic input; and operating two paths of photovoltaic input at the same time after the insulation impedance of the second path of photovoltaic input is detected. The first path of photovoltaic input is disconnected so that detection results of the insulation impedance of the second path of photovoltaic input are more accurate, which effectively resolves the problem that insulation detection is inaccurate when two paths of photovoltaic input are grid-connected, thereby increasing the safety of the inverter.

DESCRIPTION OF THE INVENTION

Exemplary embodiments are explained in detail herein, and their examples are shown in the accompanying drawings. When the following descriptions refer to the drawings, same numbers in different drawings indicate same or similar elements. The embodiments described in the following exemplary embodiments do not indicate all the embodiments identical to those of the present disclosure. On the contrary, they are only examples of devices and methods identical to those in some aspects of the present disclosure as detailed in the appended claims.

First Embodiment

Figure 1:
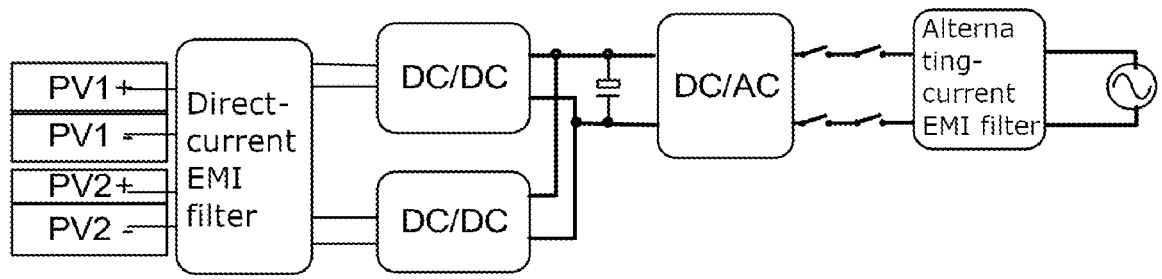
FIG. 1 is an optional structural topology diagram of a system in which a photovoltaic inverter with two paths of photovoltaic input is located according to an embodiment of the present disclosure.

In a first embodiment of the present disclosure, a method for detecting insulation impedance of a photovoltaic inverter is provided, and applied to a photovoltaic inverter with two paths of photovoltaic input. FIG. 1 is an optional structural topology diagram of a system in which a photovoltaic inverter with two paths of photovoltaic input is located. As shown in FIG. 1, two paths of photovoltaic input pass through an EMI filter, and are respectively boosted by two paths of DC/DC, and in sequence electrically connected to a bus capacitor, a bi-directional DC/AC topology, and alternating current after passing through an EMI filter on an alternating current side.

Figure 2:
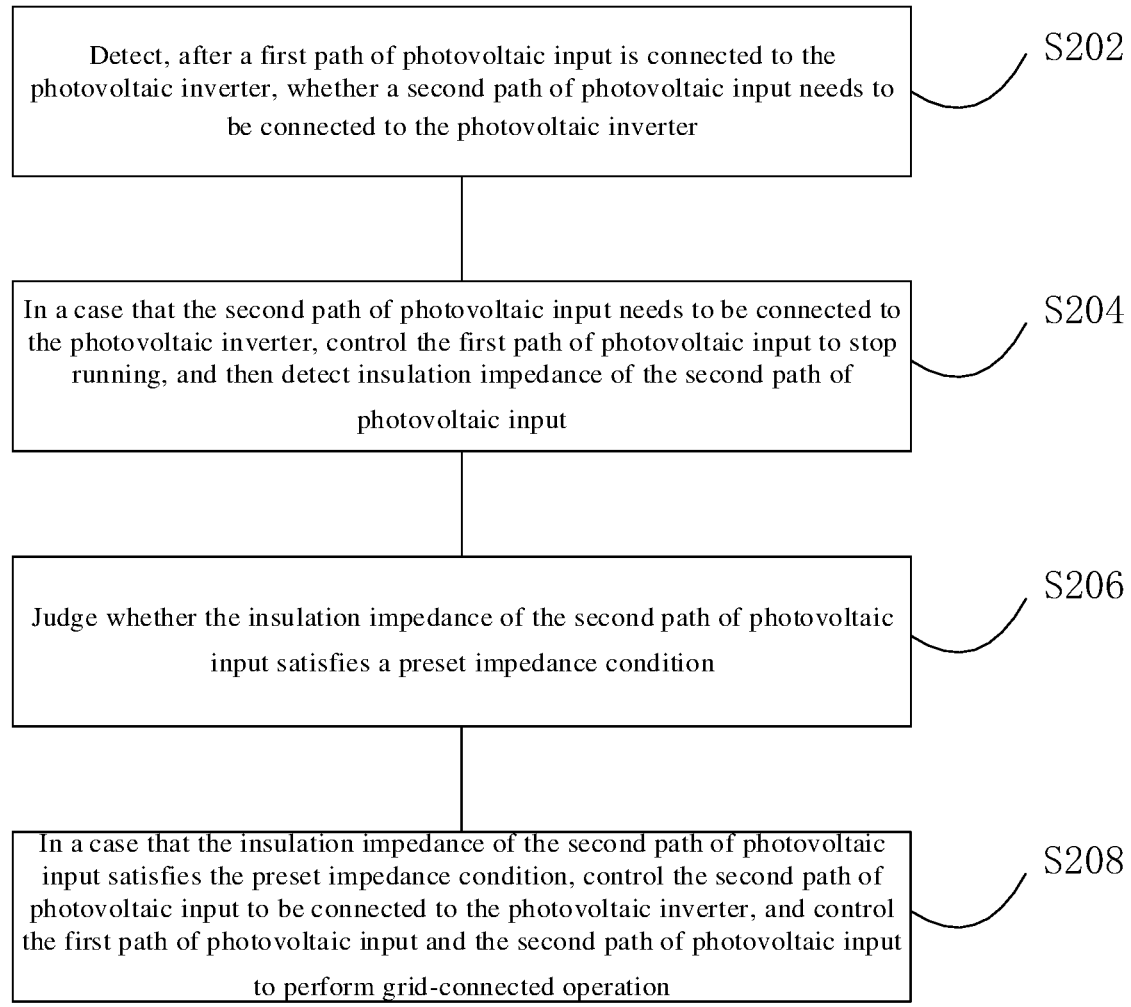
FIG. 2 is an optional flowchart of a method for detecting insulation impedance of a photovoltaic inverter according to an embodiment of the present disclosure.

In the foregoing structure, FIG. 2 is an optional flowchart of a method for detecting insulation impedance of a photovoltaic inverter. As shown in FIG. 2, the method includes the following steps S202-S208:

S202: detecting, after a first path of photovoltaic input is electrically connected to the photovoltaic inverter, whether a second path of photovoltaic input needs to be electrically connected to the photovoltaic inverter.

S204: if the second path of photovoltaic input needs to be electrically connected to the photovoltaic inverter, cause the first path of photovoltaic input to stop operating, and then detect insulation impedance of the second path of photovoltaic input.

S206. Judge whether the insulation impedance of the second path of photovoltaic input satisfies a preset impedance condition.

S208. If the insulation impedance of the second path of photovoltaic input satisfies the preset impedance condition, cause the second path of photovoltaic input to be electrically connected to the photovoltaic inverter, and cause the first path of photovoltaic input and the second path of photovoltaic input to perform grid-connected operation.

In the embodiments, a method for detecting insulation impedance of two paths of photovoltaic input is provided. The method includes: connecting, when one path of photovoltaic input is in normal operation, the other path of photovoltaic input; detecting, after a first path of photovoltaic input stops operating, insulation impedance of a second path of photovoltaic input, and then judging the insulation impedance of the second path of photovoltaic input; and operating two paths of photovoltaic input at the same time after the insulation impedance of the second path of photovoltaic input is detected. The first path of photovoltaic input is disconnected so that detection results of the insulation impedance of the second path of photovoltaic input are more accurate, which effectively resolves the problem that insulation detection is inaccurate when two paths of photovoltaic input are grid-connected, thereby increasing the safety of the inverter.

Before connecting the first path of photovoltaic input to the photovoltaic inverter, the method further includes: causing a system in which the photovoltaic inverter is located to perform initialization configuration; and causing the unit to perform safety self-test, and performing mode configuration after the safety self-test passes. After the performing mode configuration, the method further includes: judging whether an input voltage satisfies a preset voltage condition; and if the input voltage satisfies the preset voltage condition, trigger the first path of photovoltaic input to be electrically connected to the photovoltaic inverter.

The step of judging whether an input voltage satisfies a preset voltage condition includes: detecting whether the input voltage is greater than a preset first input voltage; if the input voltage is greater than the preset first input voltage, determining that the input voltage satisfies the preset voltage condition; or if the input voltage is less than the preset first input voltage, detecting, after a preset delay, whether the input voltage is less than a preset second input voltage, where the preset second input voltage is less than the preset first input voltage; and if the input voltage is less than the preset second input voltage, determining that the input voltage does not satisfy the preset voltage condition. the step of causing a unit in which the photovoltaic inverter is located to perform initialization configuration includes: causing resetting of each IO port and assigning an initial value to each variable. The step of causing the unit to perform safety self-test includes at least one of the following: detecting whether power grid frequency is normal, detecting whether an AD sampling bias voltage needs to be calibrated, and detecting whether leakage current exceeds a preset limit.

Figure 3:
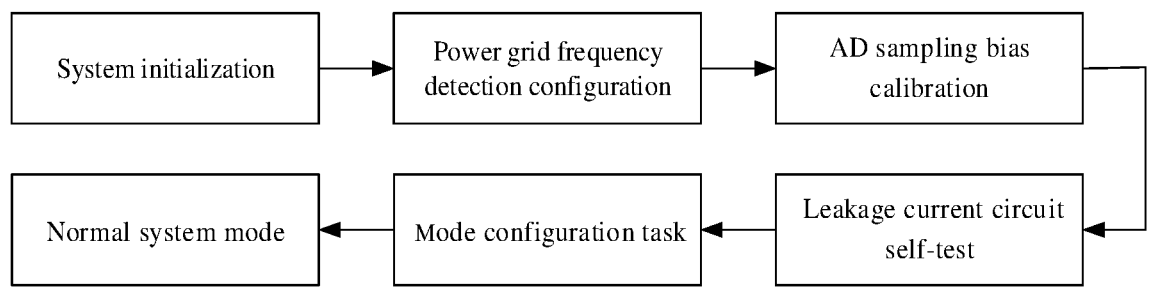
FIG. 3 is an optional flowchart of an initialization method according to an embodiment of this disclosure.

FIG. 3 is an optional flowchart of the initialization method. As shown in FIG. 3, the method includes the following steps: system initialization—power grid frequency detection configuration— AD sampling bias calibration—leakage current circuit self-test—mode configuration task—normal system mode.

Specifically, after the inverter is powered on, a plurality of steps need to be used to detect whether the hardware of the unit is normal, so as to ensure the normal operation of the unit. Initialization configuration of unit operation is mainly to reset each IO port controlled by a CPU (central processing unit) and assign an initial value to each variable. Temperature drift and zero drift cause detection values of a current sensor and a voltage sensor to have relatively large errors. Generally, when the current sensor and the voltage sensor are powered on, the detection values are calibrated to ensure their precision. According to detection regulations of single fault in safety standards of an inverter (IEC 62109-2), a leakage current sensor needs to be self-tested to judge whether the leakage current sensor is damaged before powered on and can detect leakage current exceeding a limit. To cope with different application scenarios, a plurality of modes are configured for the unit, such as change of PWM modulation mode, photovoltaic restart function, air conditioning mode, or inverter mode. If a user has no configuration, the unit runs normally based on default configuration.

After the initialization, the system can execute three cases: connecting only one of two paths of photovoltaic input, connecting two paths of photovoltaic input at the same time, and connecting one path of photovoltaic input and the other path of photovoltaic input successively.

(1) Connecting only one of two paths of photovoltaic input: perform initialization configuration on the unit; detect power grid frequency; verify AD calibration; and perform leakage current self-test and mode configuration; after all the foregoing detections are completed normally, judge photovoltaic input voltage through hysteresis detection. If the input voltage value satisfies a condition, judge whether an insulation impedance judging flag bit is zero. Only when the insulation impedance judging flag bit of the path of photovoltaic input is zero, start to judge insulation impedance; in addition, set the insulation impedance judging flag bit as one; if the insulation impedance judging flag bit is not one, return to an insulation impedance judging step; continue to judge an insulation impedance flag bit to be detected, start to calculate insulation impedance results of photovoltaic input 1 positive to ground and negative to ground. As compared with setting protection, the results are observed whether to have abnormal insulation detection. If the insulation detection is normal, proceed to a next step to normally generate power, and reset an insulation impedance judging flag bit of a first path of photovoltaic input.

Figure 4:
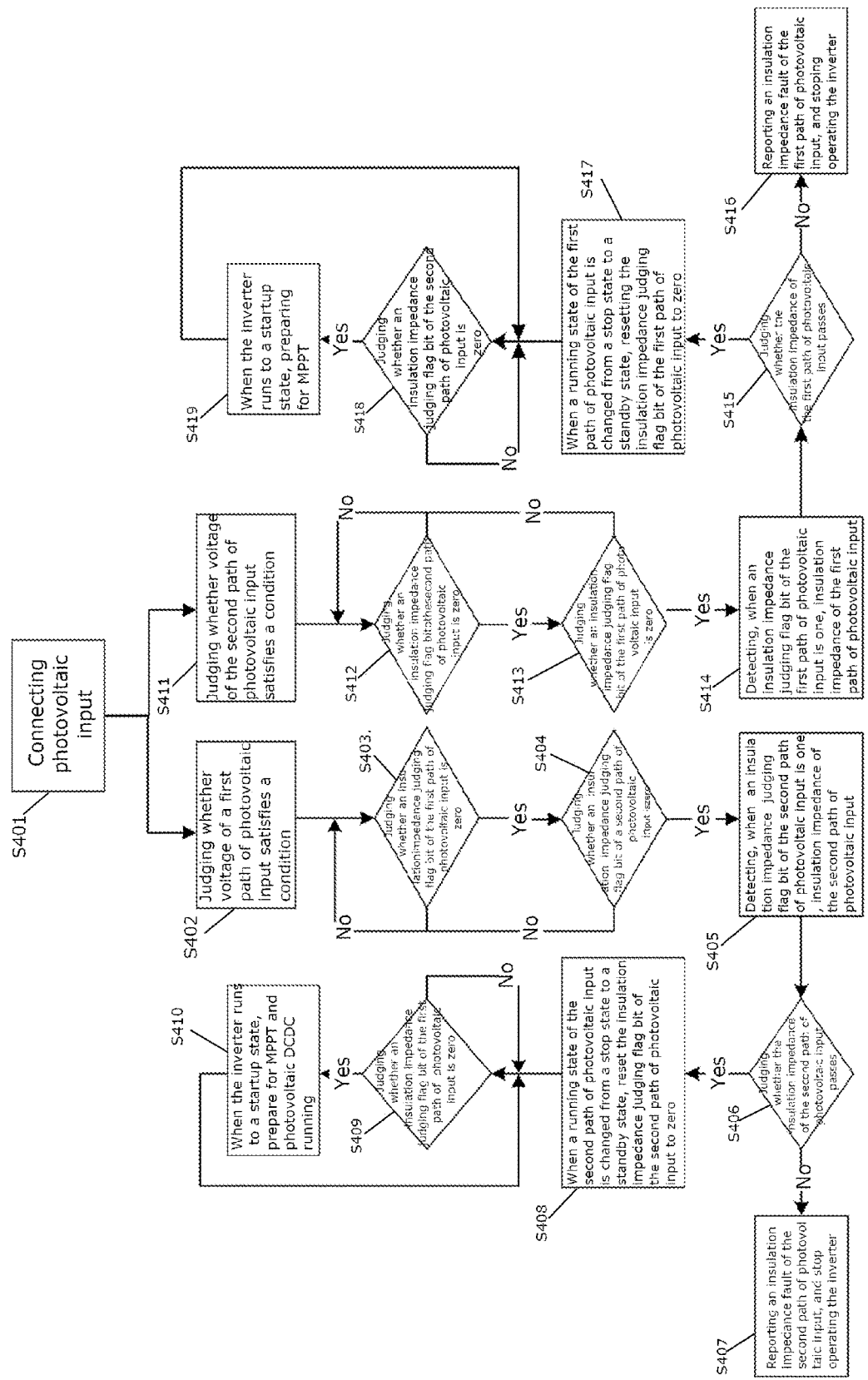
FIG. 4 is another optional flowchart of a method for detecting insulation impedance of a photovoltaic inverter according to an embodiment of the present disclosure.

FIG. 4 is an optional flowchart of the method for detecting insulation impedance of a photovoltaic inverter. As shown in FIG. 4, the method includes the following steps S401-S419:

S401. Connect photovoltaic input.

S402. Judge whether voltage of a first path of photovoltaic input satisfies a condition.

S403. Judge whether an insulation impedance judging flag bit of the first path of photovoltaic input is zero.

S404. Judge whether an insulation impedance judging flag bit of a second path of photovoltaic input is zero.

S405. Detect, when an insulation impedance judging flag bit of the second path of photovoltaic input is one, insulation impedance of the second path of photovoltaic input.

S406. Judge whether the insulation impedance of the second path of photovoltaic input passes.

S407. Report an insulation impedance fault of the second path of photovoltaic input, and stop operating the inverter.

S408. When a running state of the second path of photovoltaic input is changed from a stop state to a standby state, reset the insulation impedance judging flag bit of the second path of photovoltaic input to zero.

S409. Judge whether an insulation impedance judging flag bit of the first path of photovoltaic input is zero.

S410. When the inverter runs to a startup state, prepare for MPPT and photovoltaic DCDC running.

S411. Judge whether voltage of the second path of photovoltaic input satisfies a condition.

S412. Judge whether an insulation impedance judging flag bit of the second path of photovoltaic input is zero.

S413. Judge whether an insulation impedance judging flag bit of the first path of photovoltaic input is zero.

S414. Detect, when an insulation impedance judging flag bit of the first path of photovoltaic input is one, insulation impedance of the first path of photovoltaic input.

S415. Judge whether the insulation impedance of the first path of photovoltaic input passes.

S416. Report an insulation impedance fault of the first path of photovoltaic input, and stop operating the inverter.

S417. When a running state of the first path of photovoltaic input is changed from a stop state to a standby state, reset the insulation impedance judging flag bit of the first path of photovoltaic input to zero.

S418. Judge whether an insulation impedance judging flag bit of the second path of photovoltaic input is zero.

S419. When the inverter runs to a startup state, prepare for MPPT.

(2) Connecting two paths of photovoltaic input at the same time: if the two paths of photovoltaic input satisfy a power generation condition, detect the insulation impedance of the first path of photovoltaic input. After the insulation impedance of the first path of photovoltaic input is detected, the first path of photovoltaic input is not started. Only after the insulation impedance of the second path of photovoltaic input is also detected, the two paths of photovoltaic input are normally started.

(3) Connecting one path of photovoltaic input and the other path of photovoltaic input successively: this case is intended for connecting the other path of photovoltaic input while one path of photovoltaic input is in normal operation. For example, the second path of photovoltaic input is connected while the first path of photovoltaic input runs. In this case, the first path of photovoltaic input is in normal operation, but the running condition thereof includes judgment of the insulation impedance of the second path of photovoltaic input. In order to detect the insulation impedance of the second path of photovoltaic input, the insulation impedance judging flag bit of the second path of photovoltaic input is set to 1. In this case, the first path of photovoltaic input stops operating, the insulation impedance of the second path of photovoltaic input is judged, and two paths of photovoltaic input run simultaneously after the insulation impedance of the second path of photovoltaic input is detected.

Figure 5:
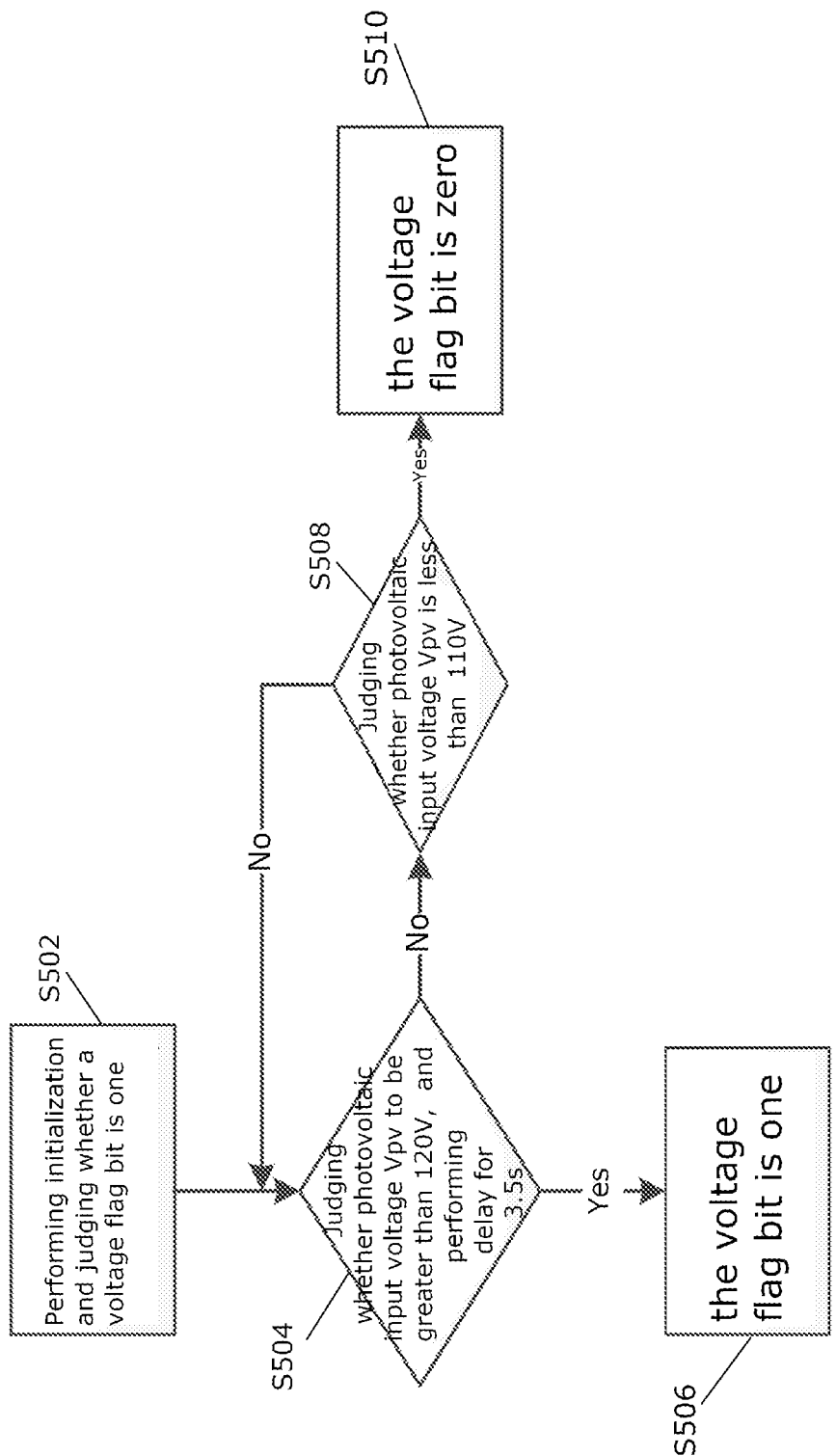
FIG. 5 is an optional flowchart of a photovoltaic input voltage determining method according to an embodiment of the present disclosure.

In actual cases, the change of environment causes a change in photovoltaic input voltage. In addition, MMPT judges whether photovoltaic input is started only depending on an open-circuit voltage lower limit, which is prone to cause repeated restart of photovoltaic input. In view of this, a method for determining whether photovoltaic input voltage satisfies a condition is further provided in an first embodiment of the present disclosure. Specifically, FIG. 5 is an optional flowchart of the method. As shown in FIG. 5, the method includes the following steps S502-S510:

S502. Perform initialization and judge whether a voltage flag bit is one.

S504. Judge whether photovoltaic input voltage $V_{pv}$ to be greater than 120V, and perform delay for 3.5 s.

S506. Determine the voltage flag bit as being one.

S508. Judge whether photovoltaic input voltage $V_{pv}$ is less than 110V.

S510. Determine the voltage flag bit as being zero.

The open-circuit voltage hysteresis detection is added, so that the open-circuit voltage fluctuates without the restart of the photovoltaic inverter, thereby avoiding repeated restart of the photovoltaic inverter when the photovoltaic open-circuit voltage changes near the lower limit.

Second Embodiment

Figure 6:
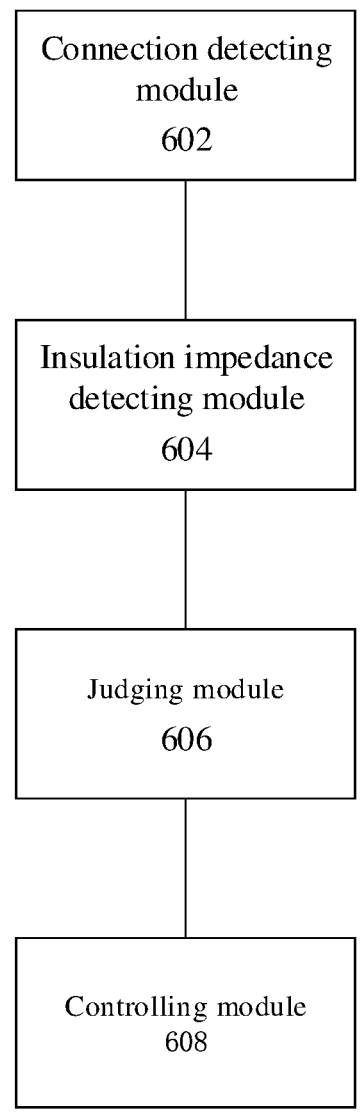
FIG. 6 is an optional structural block diagram of a device for detecting insulation impedance of a photovoltaic inverter according to an embodiment of the present disclosure.

Based on the method for detecting insulation impedance of a photovoltaic inverter provided in the first embodiment, a device for detecting insulation impedance of a photovoltaic inverter is provided in the embodiment of the present disclosure. Specifically, FIG. 6 is an optional structural block diagram of the device. As shown in FIG. 6, the device includes:

a connection detecting module 602, configured to: detect, after a first path of photovoltaic input is electrically connected to the photovoltaic inverter, whether a second path of photovoltaic input needs to be electrically connected to the photovoltaic inverter;

an insulation impedance detecting module 604 electrically connected to the connection detecting module 602, configured to: detect, after the first path of photovoltaic input stops operating, insulation impedance of the second path of photovoltaic input;

a judging module 606 electrically connected to the insulation impedance detecting module 604, configured to: judge whether the insulation impedance of the second path of photovoltaic input satisfies a preset impedance condition; and a control module 608 electrically connected to the judging module 606, configured to: cause the second path of photovoltaic input to be electrically connected to the photovoltaic inverter, and cause the first path of photovoltaic input and the second path of photovoltaic input to perform grid-connected operation.

In the embodiments, a method for detecting insulation impedance of two paths of photovoltaic input is provided. The method includes: connecting, when one path of photovoltaic input is in normal operation, the other path of photovoltaic input; detecting, after a first path of photovoltaic input stops operating, insulation impedance of a second path of photovoltaic input, and then judging the insulation impedance of the second path of photovoltaic input; and operating two paths of photovoltaic input at the same time after the insulation impedance of the second path of photovoltaic input is detected. The first path of photovoltaic input is disconnected so that detection results of the insulation impedance of the second path of photovoltaic input are more accurate, which effectively resolves the problem that insulation detection is inaccurate when two paths of photovoltaic input are grid-connected, thereby increasing the safety of the inverter.

For the apparatus in the foregoing embodiment, how the units and modules specifically implement the operations has been described in the embodiments of the method in detail, and details are not described herein.

Third Embodiment

Based on the device for detecting insulation impedance of a photovoltaic inverter provided in the second embodiment, a photovoltaic power generation system is further provided in an third embodiment of the present disclosure, including the device for detecting insulation impedance of a photovoltaic inverter.

In the embodiments, a method for detecting insulation impedance of two paths of photovoltaic input is provided. The method includes: when one path of photovoltaic input is in normal operation, the other path of photovoltaic input; detecting, after a first path of photovoltaic input stops operating, insulation impedance of a second path of photovoltaic input, and then judging the insulation impedance of the second path of photovoltaic input; and operating two paths of photovoltaic input at the same time after the insulation impedance of the second path of photovoltaic input is detected. The first path of photovoltaic input is disconnected so that detection results of the insulation impedance of the second path of photovoltaic input are more accurate, which effectively resolves the problem that insulation detection is inaccurate when two paths of photovoltaic input are grid-connected, thereby increasing the safety of the inverter.

Fourth Embodiment

Based on the photovoltaic power generation system provided in the third embodiment, a photovoltaic air conditioner further provided in a fourth embodiment of the present disclosure, including the photovoltaic power generation system.

In the embodiments, a method for detecting insulation impedance of two paths of photovoltaic input is provided. The method includes: connecting, when one path of photovoltaic input is in normal operation, the other path of photovoltaic input; detecting, after a first path of photovoltaic input stops operating, insulation impedance of a second path of photovoltaic input, and then judging the insulation impedance of the second path of photovoltaic input; and operating two paths of photovoltaic input at the same time after the insulation impedance of the second path of photovoltaic input is detected. The first path of photovoltaic input is disconnected so that detection results of the insulation impedance of the second path of photovoltaic input are more accurate, which effectively resolves the problem that insulation detection is inaccurate when two paths of photovoltaic input are grid-connected, thereby increasing the safety of the inverter.

Fifth Embodiment

Based on the method for detecting insulation impedance of a photovoltaic inverter provided in the first embodiment, a storage medium containing a computer-executable instruction is provided in the fourth embodiment of the present disclosure, where when being executed by a computer processor, the computer-executable instruction is used to perform the method for detecting insulation impedance of a photovoltaic inverter.

In the embodiments, a method for detecting insulation impedance of two paths of photovoltaic input is provided. The method includes: when one path of photovoltaic input is in normal operation, the other path of photovoltaic input; detecting, after a first path of photovoltaic input stops operating, insulation impedance of a second path of photovoltaic input, and then judging the insulation impedance of the second path of photovoltaic input; and operating two paths of photovoltaic input at the same time after the insulation impedance of the second path of photovoltaic input is detected. The first path of photovoltaic input is disconnected so that detection results of the insulation impedance of the second path of photovoltaic input are more accurate, which effectively resolves the problem that insulation detection is inaccurate when two paths of photovoltaic input are grid-connected, thereby increasing the safety of the inverter.

Persons skilled in the art are easy to think about other embodiments of the present disclosure after considering the specification and practicing the disclosure disclosed herein. This application is intended to cover any variants, purposes or adaptive changes of the present disclosure, which follow the general principles of the present disclosure and include common knowledge or common technical means in the technical field that are not disclosed in the present disclosure. The specification and the embodiments are to be considered as only examples, and the actual scope and spirit of the present disclosure are indicated by the following claims.

It should be understood that the present disclosure is not limited to the precise structure described above and shown in the drawings, and various modifications and changes can be made without departing from its scope. The scope of the present disclosure is limited only by the appended claims.

The invention claimed is:

1. A method for detecting insulation impedance of a photovoltaic inverter, wherein the photovoltaic inverter has two paths of photovoltaic input, and the method comprises the following steps:
   detecting, after a first path of photovoltaic input is electrically connected to the photovoltaic inverter, whether a second path of photovoltaic input needs to be electrically connected to the photovoltaic inverter;
   if the second path of photovoltaic input needs to be electrically connected to the photovoltaic inverter, causing the first path of photovoltaic input to stop operating, and then detecting insulation impedance of the second path of photovoltaic input;
   judging whether the insulation impedance of the second path of photovoltaic input satisfies a preset impedance condition; and
   if the insulation impedance of the second path of photovoltaic input satisfies the preset impedance condition, causing the second path of photovoltaic input to be electrically connected to the photovoltaic inverter, and causing the first path of photovoltaic input and the second path of photovoltaic input to perform grid-connected operation.

2. The method for detecting insulation impedance of a photovoltaic inverter according to claim 1, before the step of electrically connecting the first path of photovoltaic input to the photovoltaic inverter, further comprising the following steps:
   causing a unit in which the photovoltaic inverter is located to perform initialization configuration; and
   causing the unit to perform safety self-test, and
   performing mode configuration after the safety self-test passes.

3. The method for detecting insulation impedance of a photovoltaic inverter according to claim 2, after the step of performing mode configuration, further comprising the following steps:
   judging whether an input voltage satisfies a preset voltage condition; and
   if the input voltage satisfies the preset voltage condition, causing the first path of photovoltaic input to be electrically connected to the photovoltaic inverter.

4. The method for detecting insulation impedance of a photovoltaic inverter according to claim 3, wherein the step of judging whether an input voltage satisfies a preset voltage condition comprises:
   detecting whether the input voltage is greater than a preset first input voltage; and
   if the input voltage is greater than the preset first input voltage, determining that the input voltage satisfies the preset voltage condition;
   if the input voltage is less than the preset first input voltage, detecting, after a preset delay, whether the input voltage is less than a preset second input voltage, wherein the preset second input voltage is less than the preset first input voltage; and if the input voltage is less than the preset second input voltage, determining that the input voltage does not satisfy the preset voltage condition.

5. The method for detecting insulation impedance of a photovoltaic inverter according to claim 2, wherein the step of causing a unit in which the photovoltaic inverter is located to perform initialization configuration comprises:
causing resetting of each IO port and assigning an initial value to each variable.

6. The method for detecting insulation impedance of a photovoltaic inverter according to claim 2, wherein the step of causing the unit to perform safety self-test comprises at least one of the following steps:
detecting whether power grid frequency is normal;
detecting whether an AD sampling bias voltage needs to be calibrated, and
detecting whether leakage current exceeds a limit.

7. The method for detecting insulation impedance of a photovoltaic inverter according to claim 1, further comprising:
detecting, when the first path of photovoltaic input and the second path of photovoltaic input are not electrically connected to the photovoltaic inverter, whether the first path of photovoltaic input and the second path of photovoltaic input need to be electrically connected to the photovoltaic inverter;
if the first path of photovoltaic input and the second path of photovoltaic input need to be electrically connected to the photovoltaic inverter, detecting insulation impedance of the first path of photovoltaic input, and judging whether the insulation impedance of the first path of photovoltaic input satisfies the preset impedance condition;
if the insulation impedance of the first path of photovoltaic input satisfies the preset impedance condition, detecting the insulation impedance of the second path of photovoltaic input, and judging whether the insulation impedance of the second path of photovoltaic input satisfies the preset impedance condition; and if the insulation impedance of the second path of photovoltaic input satisfies the preset impedance condition, causing the first path of photovoltaic input and the second path of photovoltaic input to perform grid-connected operation.

8. A storage medium containing computer-executable instructions, wherein when being executed by a computer processor, the computer-executable instruction is configured to perform the method for detecting insulation impedance of a photovoltaic inverter according to claim 1.

9. A device for detecting insulation impedance of a photovoltaic inverter, wherein the photovoltaic inverter has two paths of photovoltaic input, and the device comprises:
a connection detecting module, configured to: detect, after a first path of photovoltaic input is electrically connected to the photovoltaic inverter, whether a second path of photovoltaic input needs to be electrically connected to the photovoltaic inverter;
an insulation impedance detecting module, electrically connected to the connection detecting module and configured to: detect, after the first path of photovoltaic input stops operating, insulation impedance of the second path of photovoltaic input;
a judging module, electrically connected to the insulation impedance detecting module and configured to: judge whether the insulation impedance of the second path of photovoltaic input satisfies a preset impedance condition; and
a control module, electrically connected to the judging module and configured to: cause the second path of photovoltaic input to be electrically connected to the photovoltaic inverter, and cause the first path of photovoltaic input and the second path of photovoltaic input to perform grid-connected operation.

10. A photovoltaic power generation system, comprising the device for detecting insulation impedance of a photovoltaic inverter according to claim 9.

11. A photovoltaic air conditioner, comprising the photovoltaic power generation system according to claim 10.

\* \* \* \* \*